United States Patent
Disney

(10) Patent No.: US 10,453,830 B2
(45) Date of Patent: Oct. 22, 2019

(54) INTEGRATED III-V DEVICE AND DRIVER DEVICE UNITS AND METHODS FOR FABRICATING THE SAME

(71) Applicant: Globalfoundries Singapore Pte. Ltd., Singapore (SG)

(72) Inventor: Donald Ray Disney, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 65 days.

(21) Appl. No.: 15/280,115

(22) Filed: Sep. 29, 2016

(65) Prior Publication Data
US 2018/0090472 A1  Mar. 29, 2018

(51) Int. Cl.
*H01L 25/16* (2006.01)
*H01L 25/00* (2006.01)
(Continued)

(52) U.S. Cl.
CPC .............. *H01L 25/16* (2013.01); *H01L 25/18* (2013.01); *H01L 25/50* (2013.01); *H01L 24/05* (2013.01); *H01L 24/13* (2013.01); *H01L 24/16* (2013.01); *H01L 24/81* (2013.01); *H01L 24/94* (2013.01); *H01L 29/2003* (2013.01); *H01L 29/41766* (2013.01); *H01L 29/7786* (2013.01); *H01L 2224/0345* (2013.01); *H01L 2224/0401* (2013.01); *H01L 2224/05022* (2013.01); *H01L 2224/05082* (2013.01); *H01L 2224/05083* (2013.01); *H01L 2224/05124* (2013.01); *H01L 2224/05139* (2013.01); *H01L 2224/05144* (2013.01); *H01L 2224/05147* (2013.01); *H01L 2224/05155* (2013.01); *H01L 2224/05166* (2013.01); *H01L 2224/05169* (2013.01); *H01L 2224/05572* (2013.01); *H01L 2224/05624* (2013.01); *H01L 2224/05639* (2013.01); *H01L 2224/05644* (2013.01); *H01L 2224/05647* (2013.01); *H01L 2224/131* (2013.01);
(Continued)

(58) Field of Classification Search
CPC ... H01L 25/16; H01L 29/778; H01L 25/0657; H01L 29/2003; H01L 25/50; H01L 21/8252; H01L 27/088; H01L 27/0605; H01L 24/17; H01L 2924/00014; H01L 24/94; H01L 24/03; H01L 2224/0345; H01L 2224/05
USPC .......................................................... 257/76
See application file for complete search history.

(56) References Cited

U.S. PATENT DOCUMENTS 9,774,322 B1 *  9/2017  Duduman ............ H03K 17/223
2014/0070786 A1 *  3/2014  Guerra ................... G05F 1/618
                                                                 323/285
(Continued)

*Primary Examiner* — Bo Fan
(74) *Attorney, Agent, or Firm* — Thompson Hine LLP

(57) ABSTRACT

Integrated circuits, wafer level integrated III-V device and CMOS driver device packages, and methods for fabricating products with integrated III-V devices and silicon-based driver devices are provided. In an embodiment, an integrated circuit includes a semiconductor substrate and a plurality of transistors in and/or overlying the semiconductor substrate. The plurality of transistors form a gate driver circuit. The integrated circuit further includes a gate driver electrode coupled to the gate driver circuit. Also, the integrated circuit includes a III-V device electrode overlying and coupled to the gate driver electrode. The integrated circuit includes a III-V device overlying and coupled to the III-V device electrode.

20 Claims, 3 Drawing Sheets

(51) Int. Cl.
  *H01L 25/18*    (2006.01)
  *H01L 23/00*    (2006.01)
  *H01L 29/20*    (2006.01)
  *H01L 29/417*   (2006.01)
  *H01L 29/778*   (2006.01)

(52) U.S. Cl.
  CPC   *H01L 2224/133* (2013.01); *H01L 2224/1329* (2013.01); *H01L 2224/16145* (2013.01); *H01L 2224/16148* (2013.01); *H01L 2224/291* (2013.01); *H01L 2224/2919* (2013.01); *H01L 2224/32245* (2013.01); *H01L 2224/48245* (2013.01); *H01L 2224/73207* (2013.01); *H01L 2224/81815* (2013.01); *H01L 2224/94* (2013.01); *H01L 2924/00014* (2013.01); *H01L 2924/1033* (2013.01); *H01L 2924/10253* (2013.01); *H01L 2924/13064* (2013.01); *H01L 2924/13091* (2013.01); *H01L 2924/1426* (2013.01)

(56)         References Cited

U.S. PATENT DOCUMENTS

2015/0162832 A1* 6/2015 Briere ............... H01L 27/0255
                                                    323/271
2016/0260287 A1* 9/2016 Baron ............... G07F 17/3244

\* cited by examiner

INTEGRATED III-V DEVICE AND DRIVER DEVICE UNITS AND METHODS FOR FABRICATING THE SAME

TECHNICAL FIELD

The technical field generally relates to group III-V devices, and more particularly relates to group III-V devices and their integration with driver devices, such as CMOS or silicon-based driver devices.

BACKGROUND

Group III-V semiconductor devices are semiconductor devices formed from compounds with at least one group III element (IUPAC group 13) and at least one group V element (IUPAC group 15). Group III elements include boron, aluminum, gallium, indium, and thallium. Group V elements include nitrogen, phosphorus, arsenic, antimony, and bismuth. Currently, nitrogen is the most commonly used group V element in semiconductor devices.

Group III-V semiconductor compounds, such as gallium nitride (GaN) and its related alloys, are known to be well suited for the formation of optical devices. The large bandgap and high electron saturation velocity of the group III-V semiconductor compounds also make them excellent candidates for applications in high temperature and high-speed power electronics. For example, GaN is frequently used in forming diodes and transistors including light-emitting diodes (LEDs), laser diodes, and UV photodetectors. GaN devices are particularly suited for use in power devices that are required to provide high current capability, such as radiofrequency (RF) amplification, high voltage power amplification, and optoelectronics.

However, it is difficult to obtain GaN bulk crystals due to the high equilibrium pressure of nitrogen at typical growth temperatures. To form GaN devices, GaN is commonly deposited epitaxially on silicon having a (111) crystal orientation. However, silicon (111) substrates suffer from interface traps and are not suitable for the formation of complementary metal oxide semiconductor (CMOS) devices. Therefore, GaN device fabrication and CMOS device fabrication are not commonly integrated over a common substrate.

To form integrated circuits with GaN devices and CMOS devices, CMOS devices are typically formed on a first substrate, such as a silicon (100) substrate and GaN devices are formed on a second substrate, such as a silicon (111) substrate. The GaN devices and CMOS devices are then connected together using various approaches including assembling the GaN and CMOS devices in separate semiconductor packages and connecting them on a printed circuit board, assembling the GaN and CMOS devices into a single package and connecting them via the package conductive materials and/or wire bonds, or using layer transfer techniques to physically couple the CMOS devices in their substrate and the GaN devices in their substrate. In the latter approach, electrical interconnects between GaN devices and CMOS devices can be formed using back-end-of-line (BEOL) semiconductor processes, such as the formation of multiple levels of dielectric layers and metal interconnection layers. Such interconnections between integrated GaN and CMOS devices have encountered issues such as poor adhesion of the metal layers. Further, current methods for electrically connecting GaN devices and CMOS devices are time-consuming and expensive.

Accordingly, it is desirable to provide simpler and more efficient group III-V device and CMOS compatible integration schemes and enabling methodology. Also, it is desirable to provide improved methods for fabricating group III-V device and silicon-based driver devices. It is desirable to provide wafer level integrated III-V device and CMOS driver device packages and methods for fabricating wafer level integrated III-V device and CMOS driver device packages that reduce packaging costs and provide improved performance. Furthermore, other desirable features and characteristics will become apparent from the subsequent detailed description and the appended claims, taken in conjunction with the accompanying drawings and this background.

BRIEF SUMMARY

Integrated circuits, wafer level integrated III-V device and CMOS driver device packages, and methods for fabricating products with integrated III-V devices and silicon-based driver devices are provided. In an embodiment, an integrated circuit includes a semiconductor substrate and a plurality of transistors in and/or overlying the semiconductor substrate. The plurality of transistors form a gate driver circuit. The integrated circuit further includes a gate driver electrode coupled to the gate driver circuit. Also, the integrated circuit includes a III-V device electrode overlying and coupled to the gate driver electrode. The integrated circuit includes a III-V device overlying and coupled to the III-V device electrode.

In another exemplary embodiment, a wafer level integrated III-V device and CMOS driver device package is provided. The package includes a semiconductor substrate including gate driver circuit regions. Each gate driver circuit region includes a gate driver circuit in and/or overlying the semiconductor substrate. The package further includes gate driver electrodes overlying the gate driver circuits. Each gate driver electrode is coupled to at least one gate driver circuit. The package also includes III-V device electrodes overlying and coupled to the gate driver electrodes and III-V devices overlying and coupled to the III-V device electrodes. At least one III-V device is located in each gate driver circuit region.

In yet another exemplary embodiment, a method for fabricating a product with an integrated III-V device and silicon-based driver device is provided. The method includes forming an integrated circuit (IC) in and/or over a silicon substrate. The method includes forming a bond pad over the integrated circuit and electrically connecting the bond pad to a component of the integrated circuit. The method includes forming a III-V device over a second substrate. Also, the method includes mechanically and electrically coupling the III-V device to the bond pad to form the product.

Another exemplary embodiment provides a method for fabricating an integrated boost converter. The method includes forming a power integrated circuit (PIC) in a silicon substrate, wherein the PIC includes metal-oxide-semiconductor (MOS) transistors configured to form a gate driver circuit. The method includes forming a first metallization layer pad over a top surface of the silicon substrate. The method further includes configuring portions of the first metallization layer to form a low voltage (LV) electrode, a high voltage (HV) electrode, and a gate-output electrode of the PIC. The method includes fabricating a gallium nitride (GaN) transistor in compound semiconductor layers of GaN and aluminum gallium nitride (AlGaN) formed over a second substrate. The second substrate includes silicon, sapphire, or silicon carbide. The method also includes forming a second metallization layer on the GaN transistor and configuring portions of the second metallization layer to form a drain electrode, a gate electrode, and a source electrode. Further, the method includes forming first, second, and third solder bumps on the drain, gate, and source electrodes of the GaN transistor, respectively; placing the GaN transistor on top of the PIC such that the first, second, and third solder bumps are in contact with the HV electrode, the gate-output electrode, and the LV electrode, respectively; and reflowing the solder bumps to provide electrical and mechanical coupling between the GaN transistor and the PIC.

This summary is provided to introduce a selection of concepts in a simplified form that are further described below in the detailed description. This summary is not intended to identify key features or essential features of the claimed subject matter, nor is it intended to be used as an aid in determining the scope of the claimed subject matter.

BRIEF DESCRIPTION OF THE DRAWINGS

The various embodiments will hereinafter be described in conjunction with the following drawing figures, wherein like numerals denote like elements, and wherein.

DETAILED DESCRIPTION

Figure 1:
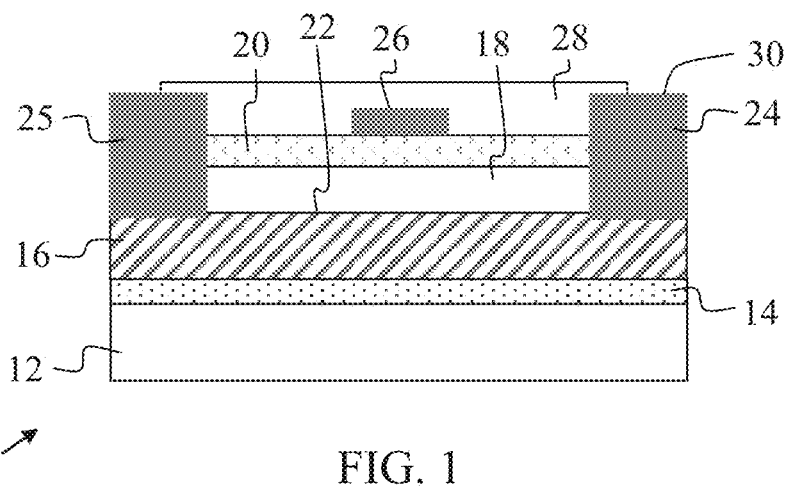
FIGS. 1-2 are cross-sectional views illustrating a process for forming a III-V device according to an exemplary embodiment.

The following detailed description is merely exemplary in nature and is not intended to limit the integrated circuits, wafer level integrated III-V device and CMOS driver device packages, and methods for fabricating products with integrated III-V devices and silicon-based driver devices. Furthermore, there is no intention to be bound by any expressed or implied theory presented in the preceding technical field, background or brief summary, or in the following detailed description.

For the sake of brevity, conventional techniques related to integrated circuit (IC) device fabrication, including CMOS device and group III-V device fabrication, may not be described in detail herein. Moreover, the various tasks and processes described herein may be incorporated into a more comprehensive procedure or process having additional functionality not described in detail herein. In particular, various processes in the fabrication of integrated circuits are well-known and so, in the interest of brevity, many conventional processes will only be mentioned briefly herein or will be omitted entirely without providing the well-known process details.

As used herein, it will be understood that when an element or layer is referred to as being "over" another element or layer, it may be directly on the other element or layer, or intervening elements or layers may be present. When an element or layer is referred to as being "on" another element or layer, it is directly on and in contact with the other element or layer. Further, spatially relative terms, such as "above", "lower", "upper", "top" and the like, may be used herein for ease of description to describe one feature's relationship to another feature(s) as illustrated in the figures. It will be understood that the spatially relative terms are intended to encompass different orientations of the device in use or operation in addition to the orientation depicted in the figures. For example, if the device in the figures is turned over, elements described as being "below" or "beneath" other elements or features would then be oriented "above" the other elements or features. Thus, the exemplary term "below" can encompass either an orientation of above or an orientation of below. The device may be otherwise oriented (rotated 90 degrees or at other orientations) and the spatially relative descriptors used herein may likewise be interpreted accordingly.

In accordance with the various embodiments herein, integrated circuits, wafer level integrated III-V device and CMOS driver device packages, and methods for fabricating products with integrated III-V devices and silicon-based driver devices are provided. The methods described herein provide for the formation and packaging of III-V devices and associated driver devices together. As a result, packaging costs can be greatly reduced. The Figures illustrate exemplary embodiments for III-V devices, driver devices, and integrated units including III-V device and driver devices, and for fabricating integrated III-V device and driver device units.

Figure 2:
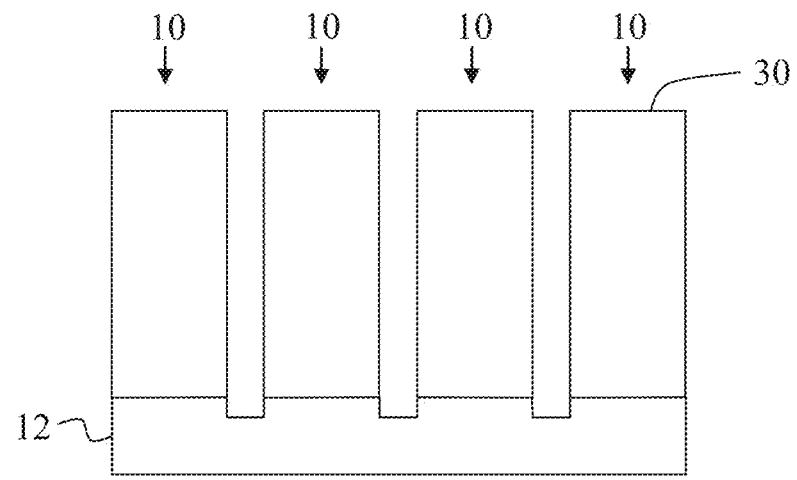

FIGS. 1-2 are cross-sectional views illustrating a process for forming a III-V device 10 according to an exemplary embodiment. In FIG. 1, a substrate 12 is provided. An exemplary substrate 12 is a silicon, silicon carbide, or sapphire wafer. The substrate 12 may alternatively be a ZnO substrate, a nitride semiconductor substrate, or a substrate of another suitable material.

As shown, a buffer layer 14 is formed over and on substrate 12. Buffer layer 14 may include a single layer or a stack of layers. In an exemplary embodiment, the buffer layer 14 is formed over the substrate 12 to gradually adjust the lattice constant from the lattice constant of the substrate 12 to a lattice constant more similar to layers formed overlying the buffer layer 14 (such as active GaN layers, as described below). When active GaN layers are formed on non-native substrates, i.e., non-GaN substrates, dislocations and other defects may be introduced into the active GaN layer due to the mismatch between the lattice constants, as well as the coefficients of thermal expansion (CTE), between the underlying substrate and the GaN layers. It is noted that a sapphire or silicon carbide substrate will have a lattice constant that is closer to the lattice constant of GaN as compared to a silicon substrate, and may provide for formation of higher-quality GaN layers or for use of fewer buffer layers. However, silicon substrates offer the advantage of being available in larger wafer sizes at much lower cost, and are compatible with a large installed base of silicon wafer processing equipment, resulting in lower manufacturing costs.

An exemplary buffer layer 14 is formed from layers of gallium nitride (GaN), aluminum gallium nitride (AlGaN), and aluminum nitride (AlN). The buffer layer 14 may have a total thickness of from about 0.5 to about 10 microns. For example, each layer of GaN, AlGaN, and or AlN may be formed with a thickness of from about 10 nm to about 1 micron.

In FIG. 1, a first active layer 16 is formed on and over the buffer layer 14. An exemplary first active layer 16 is formed of GaN, and may be referred to as i-GaN as opposed to a doped GaN material such as n-GaN or p-GaN. An exemplary first active layer 16 has a thickness of from about 0.5 to about 5 microns. Further, in the embodiment of FIG. 1, a second active layer 18 is formed on and over the first active layer 16. An exemplary second active layer 18 is formed of AlGaN. An exemplary second active layer 18 has a thickness of from about 0.5 to about 5 microns. Also, in the embodiment of FIG. 1, an optional cap layer 20 is formed on and over the second active layer 18. An exemplary cap layer 20 is formed of AlGaN. An exemplary cap layer 20 has a thickness of from about 0.1 to about 2 microns. In some embodiments, the second active layer 18 and cap layer 20 may include the same layer.

In an exemplary embodiment, the buffer layer 14, first active layer 16, second active layer 18, and cap layer 20 are laminated over the substrate 12 using a metal organic chemical vapor deposition (MOCVD) or a molecular beam epitaxy (MBE) process. A heterojunction 22, i.e., an interface between two layers of dissimilar crystalline semiconductors, is formed between the first active layer 16 and the second active layer 18. As a result, a two-dimensional electron gas (2 DEG) channel is formed naturally at the heterojunction 22. The 2 DEG channel may serve as a conduction channel for the III-V device 10.

After forming the active layers and cap layer 20, the process may continue with the formation of source/drain electrodes 24 and 25. The source/drain electrodes 24 and 25 may be formed as a metallization layer over the cap layer 20. For example, a suitable contact metal or stack of contact metals may be deposited over the cap layer 20 and patterned. For example, to provide good electrical contact, the contact metal may be palladium, platinum, nickel, titanium, aluminum, and the like. Additional metal layers may be laminated on top of the contact metal layers to provide a metal surface that is suitable for integration as discussed below. For example, a solderable metal stack such as titanium, nickel, and gold or silver may be laminated on top of the contact metal layers to provide a solderable metal surface. A heat treatment may be carried out to form a good ohmic connection between each source/drain electrode 24 and 25 and the underlying 2 DEG channel at the heterojunction 22. As a result, the III-V device 10 is provided with a current path from source/drain electrode 24, through the 2 DEG channel along heterojunction 22, and through source/drain electrode 25.

As further shown in FIG. 1, a gate structure 26 including a gate electrode may be formed over the cap layer 20 in accordance with conventional processing. For example, a metal or other conductive material stack may be deposited and patterned to form a Schottky contact with the first active layer 16. The gate structure 26 may modulate the conductivity of the channel at the heterojunction 22 via variation of an applied gate voltage. Alternately, a dielectric layer may separate the gate electrode from the active GaN layers, forming a metal-oxide-semiconductor gate structure 26 that likewise serves to modulate the conductivity of the channel at heterojunction 22 via variation of the applied gate voltage. In exemplary embodiments, the conductivity channel is present when zero potential is applied to the electrode of the gate structure 26, which means that the III-V device 10, which is a transistor in the embodiment of FIG. 1, is normally "ON" and can be turned "OFF" by applying a negative voltage on the electrode of the gate structure 26. In other embodiments, the III-V device 10 may be normally "OFF" and require a positive voltage on the electrode of the gate structure 26 to be turned "ON" and fully connect the channel between drain and source electrodes 24 and 25. Further, it is noted that while the III-V device 10 is formed as a transistor in FIG. 1, the III-V device 10 may be a diode or other device formed from III-V materials.

In the embodiment of FIG. 1, a passivation layer 28 is formed over the gate structure 26 and cap layer 20. An exemplary passivation layer 28 is a dielectric material such as silicon nitride, silicon dioxide, polyimide, and the like. The passivation layer 28 is removed over the source/drain electrodes 24 and 25 to allow for electrical contact to an upper surface 30 of the source/drain electrodes 24 and 25. The passivation layer 28 may also be removed over the gate structure 26 to allow for direct electrical contact to the gate structure 26.

While FIG. 1 illustrates the formation of a single III-V device 10, the method may form a plurality of III-V devices 10 arranged side by side over the substrate 12. In FIG. 2, a plurality of III-V devices 10 has been formed over substrate 12 and a cutting process is performed to separate such III-V devices 10. While not shown, each III-V devices 10 in FIG. 2 may include buffer layer 14, first active layer 16, second active layer 18, cap layer 20, source/drain electrodes 24 and 25, gate structure 26 and passivation layer 28 as described in relation to the process of FIG. 1.

In an exemplary embodiment, a dicing process (e.g. laser dicing, dicing with a diamond stylus, or dicing by sawing) is performed to separate individual III-V devices 10. As shown, an exemplary dicing process separates the individual III-V devices 10 while the substrate 12 remains at least partially uncut. Each individual III-V device 10 includes the upper surface 30.

Figure 3:
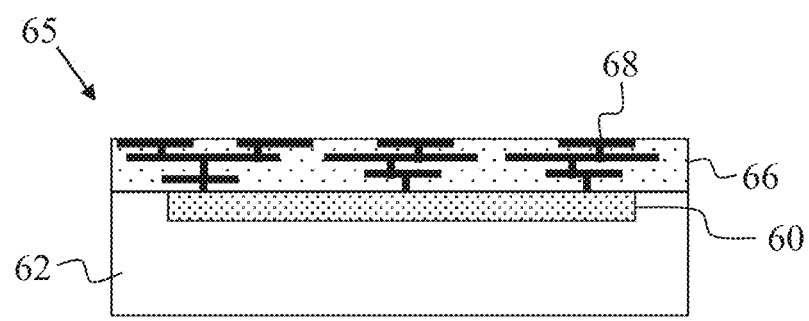
FIGS. 3-4 are cross-sectional views illustrating a process for forming a driver device and electrical connection structures according to an exemplary embodiment.
Figure 4:
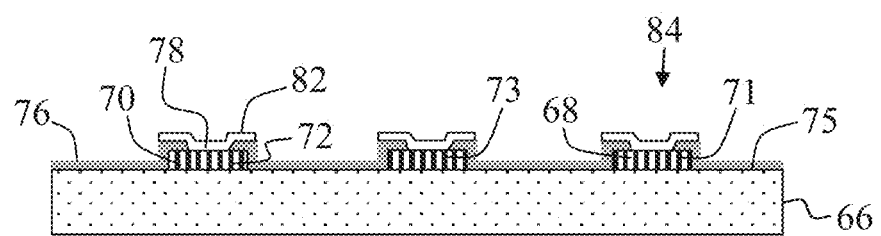

FIGS. 1-2 illustrate a process for forming III-V devices 10 according to an exemplary embodiment. In FIGS. 3-4, a process is illustrated for forming a driver device 60 and interconnection structures thereto according to an exemplary embodiment.

As shown in FIG. 3, a semiconductor substrate 62 in and/or on which semiconductor devices are fabricated is provided. As used herein, the term "semiconductor substrate" encompasses semiconductor materials conventionally used in the semiconductor industry from which to make electrical devices. Semiconductor materials include monocrystalline silicon materials, such as the relatively pure or lightly impurity-doped monocrystalline silicon materials typically used in the semiconductor industry, as well as polycrystalline silicon materials, and silicon admixed with other elements such as germanium, carbon, and the like. In addition, "semiconductor material" encompasses other materials such as relatively pure and impurity-doped germanium, gallium arsenide, zinc oxide, glass, and the like. In an exemplary embodiment, the semiconductor material is a silicon substrate, such as crystalline silicon. The silicon substrate may be a bulk silicon wafer or may be a thin layer of silicon (on an insulating layer commonly known as silicon-on-insulator or SOI) that, in turn, is supported by a carrier wafer. As referred to herein, a material that includes a recited element/compound includes the recited element/compound in an amount of at least 10 weight percent based on the total weight of the material unless otherwise indicated.

A driver device 60, such as a metal oxide field effect transistor (MOSFET) or a plurality of transistors, is formed in the semiconductor substrate 62 according to conventional integrated circuit processing. An exemplary driver device 60 forms a gate driver circuit. A plurality of driver devices 60 may be located in a gate driver circuit region 65 of an integrated circuit. The semiconductor substrate 62 may include a plurality of gate driver circuit regions 65. In an exemplary embodiment, various metal and dielectric layer deposition and etching processes may be performed according to conventional integrated circuit processing to form a dielectric 66 with an embedded metallization structure 68 in selective contact with electrodes of the driver device 60.

The driver device 60 is formed in FIG. 3 during a series of processes that form individual integrated circuit components, e.g., transistors, capacitors, resistors, etc., over substrate 62 that may be interconnected into a circuit by means of one or more metal interconnecting layers. A power integrated circuit is defined as an integrated circuit that controls high voltages, high currents, or both. For example, digital integrated circuits typically have operating voltages of 5V or lower, so any integrated circuit that controls voltages above 5V may be considered a power integrated circuit. Integrated circuits that control currents of more than 100 mA flowing through external loads may also be considered power integrated circuits. Some examples of power integrated circuits include DC/DC voltage conversion integrated circuits, e.g., buck converters, boost converters, drivers, motor drivers, etc. In an exemplary embodiment, the driver devices 60 are formed in a power integrated circuit.

FIG. 4 provides an enhanced view of the upper portion of the structure of FIG. 3 while the remaining structure of the metallization structure 68 and the underlying driver devices 60 is not shown for reasons of simplicity and clarity. In FIG. 4, the metallization structure 68 is shown to include final metal pads or bond pads 70 as an uppermost metallization layer or electrode. For example electrodes 71, 72, and 73 may be selected formed over and interconnected to the gate driver circuit formed by driver device 60. Exemplary final metal pads 70 are copper, aluminum, or another suitable conductive material. The final metal pads 70 may extend above the upper surface 75 of the interlayer dielectric 66. The final metal pads 70 may be formed as an uppermost metallization layer over the interlayer dielectric 66.

In FIG. 4, a passivation layer 76 is deposited over the final metal pads 70 and the upper surface 75 of the interlayer dielectric 66. An exemplary passivation layer 76 is one or more dielectric materials such as silicon dioxide, silicon nitride, polyimide, or the like. In an exemplary embodiment, the passivation layer 76 is deposited by plasma enhanced chemical vapor deposition (PECVD) or similar suitable process. As shown, a portion of the passivation layer 76 is removed from the final metal pads 70 to provide exposed surfaces 78 of the final metal pads 70. For example, a conventional lithography process and reactive ion etching (ME) process may be performed to selectively remove the portions of the passivation layer 76 overlying the final metal pads 70.

The method may continue with forming an under bump metallization (UBM) layer 82 over the final metal pads 70 and in contact with the exposed surfaces 78 of the final metal pads 70. An exemplary UBM layer 82 is formed of a laminated structure such as Ti/Pt/Au, Ti/Ni/Au, Ti/Ni/Ag, Ni/Au, Pt/Au or similar suitable metallization stacks. The UBM layer 82 may be formed by physical vapor deposition (PVD), evaporation, or other suitable processes. Attributes of the UBM layer for consideration include good mechanical adhesion to the final metal pads 70, a top surface that is compatible with the die attach process (discussed below), and good electrical contact between the die attach materials and the final metal pads 70.

As a result of the processing of FIGS. 3-4, an interconnection structure 84 is formed from the metal pads 70 and UBM layer 82 overlying the driver devices 60. The interconnection structure 84 is in selective electrical contact with driver devices 60.

Figure 5:
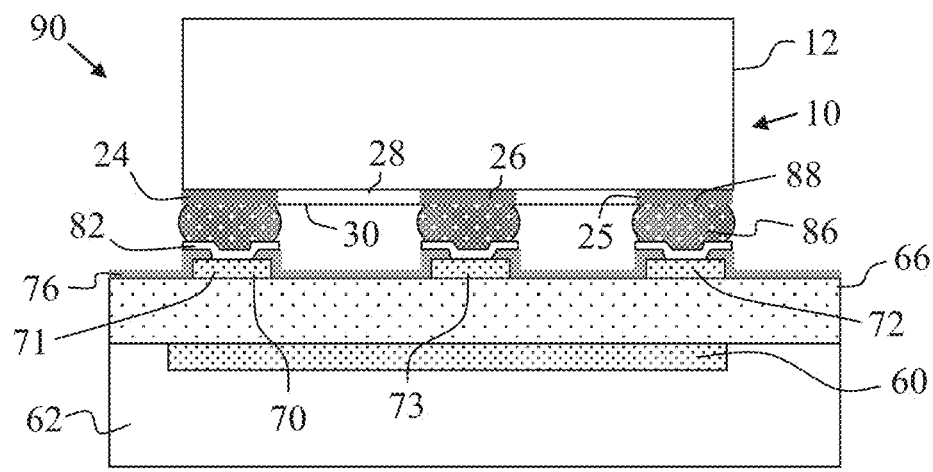
FIG. 5 is a cross-sectional view illustrating a process for connecting a III-V device to a driver device to form an integrated III-V device and driver device according to an exemplary embodiment.

The method continues in FIG. 5 with the connection of a selected III-V device 10 from FIG. 2 to the driver device 60 through the interconnection structure 84 of FIG. 4. Specifically, a die attach region 86 is positioned on each UBM layer 82, and the surface 30 of the III-V device 10 is contacted to each die attach region 86. An exemplary die attach region 86 may include a solder bump or solder layer, conductive epoxy or another suitable conductive and malleable material that may harden and adhere to provide a mechanical and electrical connection between III-V device 10 and the gate driver circuit region 65 of the integrated circuit. The die attach region 86 is deformable and forms a substantially planar upper surface 88 in contact with the source/drain electrodes 24 and 25 of III-V device 10. Further, the die attach region 86 adheres to the UBM layer 82 and to the III-V device 10 to bond the III-V device 10 and the driver device 60 together to form an integrated III-V device and driver device unit 90.

In an exemplary embodiment, the method includes forming a solder bump 86 in electrical connection with the selected III-V device 10, positioning the selected III-V device 10 over a selected driver device 60 such that the solder bump 86 is in contact with bond pad 70 and/or overlying UBM layer 82, and reflowing the solder bump 86 to provide electrical and mechanical coupling between the selected III-V device 10 and the selected driver device 60 of the integrated circuit. The solder bumps 86 may directly connect final metal pads of the integrated circuit 91 with electrodes (e.g. 24, 25, and/or 26) of the III-V device 10.

As fabricated in FIG. 5, the driver device 60 is configured to control a current flowing through the III-V device 10. In an exemplary embodiment, the III-V device 10 is a transistor including a drain electrode 24, a source electrode 25, and a gate electrode 26, while the driver device 60 includes a high voltage (HV) electrode 71, a low voltage (LV) electrode 72, and a gate-output electrode 73. As shown, the high voltage (HV) electrode 71 is coupled to the drain electrode 24 by a first solder bump 86, the low voltage (LV) electrode 72 is coupled to the source electrode 25 by a second solder bump 86, and the gate-output electrode 73 is coupled to the gate electrode 26 by a third solder bump 86.

Alternatively, electrodes 24, 25 and 26 and electrodes 71, 72, and 73 may be formed from a same, common material or metal and may be directly bonded. For example, Cu to Cu bonding or Al to Al bonding may be used.

Figure 6:
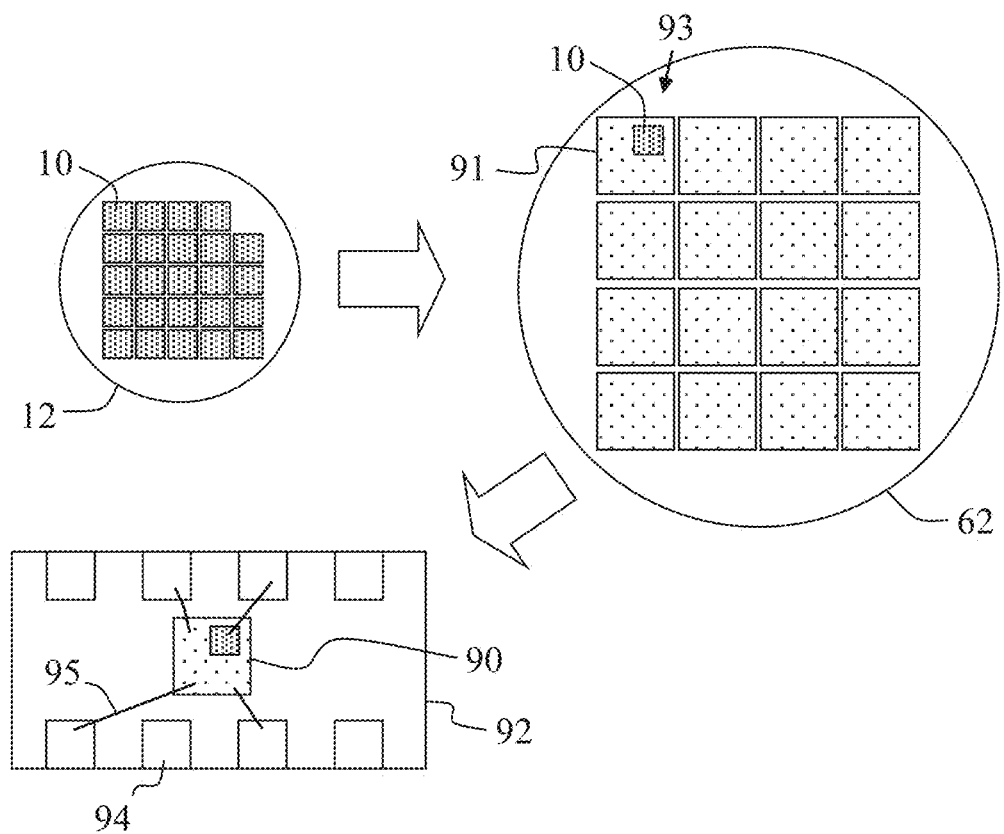
FIG. 6 is an overhead schematic view of the III-V device of FIG. 2 and the driver device of FIG. 4 during formation of an integrated III-V device and driver device according to FIG. 5.

FIG. 6 illustrates a method of forming a plurality of integrated III-V device and driver device units 90. As shown, substrate or wafer 12 includes a plurality of individual separated III-V devices 10. Further, another substrate or wafer 62 includes a plurality of integrated circuits 91. As shown, a selected III-V device 10 is separated from the other III-V devices 10 on substrate 12, such as by conventional die sawing, laser scribing, diamond scribing, or other suitable processes. The selected III-V device 10 is removed from substrate 12 and placed on top of a given integrated circuit 91 contained in substrate 62. By way of example, pick-and-place equipment may be used to place III-V device 10 on top of integrated circuit 91. This process may include a step in which III-V device 10 is flipped upside down, such that upper surface 30 of III-V device 10 is facing upper surface 75 of the ILD within integrated circuit 91. As noted above, die attach regions 86, such as solder bumps or epoxy bumps, may be formed on III-V device 10 prior to removing device 10 from substrate 12. Die attach regions 86 are positioned on the UBM layer 82 (not shown) of the selected integrated circuit 91 within substrate 62. Alternatively, the die attach regions 86 may be formed on the electrodes of integrated circuit 91, and the electrodes of the selected III-V device 10 may be positioned on die attach regions 86. In either case, the III-V device 10 is then aligned with and contacted to the interconnection structure (not shown) over the selected integrated circuit 91. As a result, an electrical and mechanical connection is formed between an integrated circuit 91 and a III-V device 10. In an exemplary embodiment, the above process is repeated with the removal of other III-V devices 10 from substrate 12 and placement of each III-V device 10 onto an integrated circuit within substrate 62. Each connected pair of III-V device 10 and driver device 60 forms an integrated III-V device and driver device unit 90. An integrated unit 91 may include one or more units 90, i.e. one or more III-V devices 10 in connection with one or more driver devices 60. The combination of an integrated circuit 91 with one or more III-V devices 10 produces a heterogeneous integrated circuit 93.

Each of the plurality of III-V devices 10 may be contacted to a respective gate driver circuit region 65 within the plurality of integrated circuits 91 on wafer 62 to form a plurality of heterogeneous integrated circuits 93 in wafer 62. The methods described herein provide for the integration of multiple III-V devices 10 with a single integrated circuit 91, and that integrated circuit 91 may contain a plurality of driver devices 60. In an exemplary embodiment, a selected integrated circuit 91 includes at least one gate driver circuit formed by one or more driver devices 60 and two III-V devices 10 to form, for example, a high-side switch and a low-side switch as commonly used in many power conversion topologies (e.g. Buck converters, boost converters, half-bridges). In another embodiment, a selected integrated circuit 91 includes at least one gate driver circuit formed by one or more driver devices 60 and four III-V devices 10 to form, for example, a full bridge stage as commonly used in many power conversion applications.

An optional passivation layer may be formed over wafer 62, which includes III-V devices 10 and integrated circuits 91. The passivation layer may be a dielectric material that is substantially conformal with the underlying gate driver circuit region 65 and III-V devices 10 and may provide mechanical protection (e.g. scratch resistance) and protection against ingress of moisture and/or mobile ions. Contact windows may be formed in selected areas of the passivation layer to allow further packaging. As manufactured, wafer 62 may be provided as a wafer level integrated III-V device and CMOS driver device package.

Alternatively, further packaging may be performed. For example, after the process of contacting selected III-V devices 10 to selected integrated circuits 91 is completed, a dicing process may be performed on the wafer 62 including the plurality of heterogeneous integrated circuits 93 to singulate the heterogeneous integrated circuits 93 from one another. The heterogeneous integrated circuits 93 are freestanding units that can be further packaged or mounted directly onto a package. In FIG. 6, the individual heterogeneous integrated circuits 93 may then be mounted directly onto a package 92 using conventional packaging techniques. For example, a heterogeneous integrated circuit 93 may be selected and removed from wafer 62 for placement on package 92 using pick-and-place equipment. Heterogeneous integrated circuit 93 may be attached to the leadframe of package 92 using conventional methods such as epoxy die attach or solder die attach. Electrical connection from the pins 94 of package 92 to the circuits of heterogeneous integrated circuit 93 may be provided by, for example, conventional wire bonding techniques. In this example, bond wires 95 may be connected between pins 94 and interconnection structures 84 of integrated circuit 91. Some bond wires 95 may also provide connection from pins 94 and the top-facing side of III-V devices 10. In another embodiment, package 92 may be a printed circuit board. The transfer of the integrated unit or units 90 to a package 92 may be performed utilizing conventional semiconductor packages and assembly equipment and techniques.

The embodiments herein provide units having a III-V device stacked directly on top of an integrated circuit that includes a driver device. As a result, the units are provided with a smaller form factor as compared to conventional III-V device systems, which utilize separate packaging of the III-V device and the driver integrated circuit. In addition to reducing the form factor, direct stacking of the III-V device and driver integrated circuit may greatly reduce the overall system costs, by reducing the number of packages. Moreover, the direct connection of III-V device and driver integrated circuit is accomplished without using an interposer (i.e. another silicon substrate that is used to provide mechanical support and electrical interconnection of both the III-V device and driver integrated circuit).

Exemplary embodiments may provide that the III-V devices and corresponding driver circuits be very tightly electrically coupled, greatly reducing the parasitic resistance, inductance, and capacitance compared to other approaches. For example, the driver devices 60 may be connected to their respective III-V devices by a solder layer that has a diameter of about 50 microns and is from about 25 to about 50 microns thick. The electrical resistance and the inductance of this connection are much smaller than the resistances and inductances of other interconnection methods, such as co-packaging of III-V devices with driver circuits and connection using bond wires (which have electrical resistance and inductance several times higher than the embodiment described herein) or placing III-V devices and driver circuits on a printed circuit board and connecting them using the PCB metal traces (which have electrical resistance and inductance orders of magnitude higher than the embodiments described herein). The benefits of reduced resistance and inductance include higher efficiency, faster switching, less voltage overshoot and ringing (which increases safe-operating area).

While at least one exemplary embodiment has been presented in the foregoing detailed description, it should be appreciated that a vast number of variations exist. It should also be appreciated that the exemplary embodiment or exemplary embodiments are only examples, and are not intended to limit the scope, applicability, or configuration as claimed in any way. Rather, the foregoing detailed description will provide those skilled in the art with a convenient road map for implementing the exemplary embodiment or exemplary embodiments. It should be understood that various changes can be made in the function and arrangement of elements without departing from the scope herein as set forth in the appended claims and the legal equivalents thereof.

What is claimed is:

1. An integrated circuit comprising:
   a silicon substrate having an uppermost surface;
   a power integrated circuit (PIC) in the silicon substrate, wherein the PIC comprises a plurality of transistors in and/or overlying the silicon substrate and forming a gate driver circuit;

a gate driver electrode disposed over the uppermost surface of the silicon substrate and coupled to the gate driver circuit;

a second substrate having an uppermost surface, wherein the second substrate comprises silicon, sapphire, or silicon carbide;

a III-V device disposed in compound semiconductor layers of gallium nitride (GaN) and aluminum gallium nitride (AlGaN) formed over the second substrate; and a III-V device electrode on the uppermost surface of the III-V device, wherein the second substrate is flipped such that the uppermost surface of the second substrate and the uppermost surface of the silicon substrate directly face one another and are distanced from one another to form a gap therebetween, and wherein the III-V device electrode is coupled to the gate driver electrode.

2. The integrated circuit of claim 1 wherein the III-V device electrode is mechanically and electrically coupled to the gate driver electrode.

3. The integrated circuit of claim 1 further comprising a solder layer directly contacting the gate driver electrode and the III-V device electrode.

4. The integrated circuit of claim 1 further comprising a solder layer directly contacting, mechanically coupling and electrically coupling the gate driver electrode and the III-V device electrode.

5. The integrated circuit of claim 1 wherein the gate driver electrode is a first metal, the III-V device electrode is the first metal, and the gate driver electrode is directly bonded to the III-V device electrode.

6. The integrated circuit of claim 1 wherein the gate driver electrode is formed in a first metallization layer and wherein the III-V device electrode is formed in a second metallization layer.

7. The integrated circuit of claim 1 wherein the III-V device is a gallium nitride (GaN) transistor.

8. The integrated circuit of claim 1 wherein:
the III-V device is a gallium nitride (GaN) transistor;
the III-V device electrode comprises a drain electrode coupled to the GaN transistor, a source electrode coupled to the GaN transistor, and a gate electrode coupled to the GaN transistor; and
the gate driver electrode comprises a high voltage (HV) electrode coupled to the drain electrode, a low voltage (LV) electrode coupled to the source electrode, and a gate-output electrode coupled to the gate electrode.

9. The integrated circuit of claim 8 further comprising:
a first solder bump directly contacting the HV electrode and directly contacting the drain electrode;
a second solder bump directly contacting the LV electrode and directly contacting the source electrode; and
a third solder bump directly contacting the gate-output electrode and directly contacting the gate electrode.

10. A wafer level integrated III-V device and CMOS driver device package comprising:
a heterogeneous integration of a semiconductor substrate including gate driver circuit regions and III-V devices overlying the semiconductor substrate, wherein the III-V devices are disposed in compound semiconductor layers of gallium nitride (GaN) and aluminum gallium nitride (AlGaN);

gate driver circuits disposed over an uppermost surface of the semiconductor substrate, wherein each gate driver circuit region includes a gate driver circuit;

gate driver electrodes overlying the gate driver circuits and overlying an uppermost surface of the compound semiconductor layers, wherein each gate driver electrode is coupled to at least one gate driver circuit; and III-V device electrodes overlying and coupled to the III-V device electrodes, wherein at least one III-V device is located in each gate driver circuit region, wherein the III-V devices are flipped such that the uppermost surface of the compound semiconductor layers and the uppermost surface of the semiconductor substrate directly face one another and are distanced from one another to form a gap therebetween, and wherein the III-V device electrodes are overlying and coupled to the gate driver electrodes.

11. The package of claim 10 wherein a selected gate driver circuit region includes one gate driver circuit and at least two III-V devices.

12. The package of claim 10 wherein a selected gate driver circuit region includes one gate driver circuit and four III-V devices.

13. The package of claim 10 further comprising a solder layer in each gate driver circuit region directly contacting a respective gate driver electrode and a respective III-V device electrode.

14. The package of claim 10 wherein the gate driver electrodes are a first metal, the III-V device electrodes are the first metal, and the gate driver electrodes are directly bonded to the III-V device electrodes.

15. The package of claim 10 wherein the gate driver electrodes are formed in a first metallization layer and wherein the III-V device electrodes are formed in a second metallization layer.

16. The package of claim 10 wherein the III-V devices include gallium nitride (GaN) transistors.

17. The package of claim 10 wherein:
the III-V devices include gallium nitride (GaN) transistors;
the III-V device electrodes comprise drain electrodes, source electrodes and gate electrodes coupled to respective GaN transistors; and
the gate driver electrodes comprise high voltage (HV) electrodes coupled to respective drain electrodes, low voltage (LV) electrodes coupled to respective source electrodes, and gate-output electrodes coupled to respective gate electrodes.

18. The package of claim 17 further comprising, for each respective gate driver circuit region:
a first solder bump directly contacting the respective HV electrode and directly contacting the respective drain electrode;
a second solder bump directly contacting the respective LV electrode and directly contacting the respective source electrode; and
a third solder bump directly contacting the respective gate-output electrode and directly contacting the respective gate electrode.

19. The integrated circuit of claim 1 wherein the III-V device is a buck converter.

20. The package of claim 10 wherein the semiconductor substrate is a silicon substrate.

* * * * *